US008802351B2

(12) United States Patent
Bozano et al.

(10) Patent No.: US 8,802,351 B2
(45) Date of Patent: Aug. 12, 2014

(54) WATER-DISPERSIBLE ELECTRICALLY CONDUCTIVE FLUORINE-CONTAINING POLYANILINE COMPOSITIONS FOR LITHOGRAPHY

(75) Inventors: Luisa Dominica Bozano, Los Gatos, CA (US); Takayuki Nagasawa, Joetsu (JP); Mark Hull Sherwood, San Jose, CA (US); Ratnam Sooriyakumaran, San Jose, CA (US); Linda Karin Sundberg, Los Gatos, CA (US); Satoshi Watanabe, Joetsu (JP)

(73) Assignees: International Business Machines Corporation, Armonk, NY (US); Shin-Etsu Chemical Co. Ltd., Tokyo (JP)

( * ) Notice: Subject to any disclaimer, the term of this patent is extended or adjusted under 35 U.S.C. 154(b) by 0 days.

(21) Appl. No.: 13/562,811

(22) Filed: Jul. 31, 2012

(65) Prior Publication Data

US 2014/0038104 A1    Feb. 6, 2014

(51) Int. Cl.
  *C08G 73/00* (2006.01)
  *G03F 7/004* (2006.01)
  *G03F 7/40* (2006.01)
  *H01B 1/00* (2006.01)

(52) U.S. Cl.
  USPC ........ 430/270.1; 430/325; 430/326; 430/330; 430/331; 252/500; 528/422

(58) Field of Classification Search
  USPC ........... 430/270.1–326, 527; 252/500–519.34
  See application file for complete search history.

(56) References Cited

U.S. PATENT DOCUMENTS

| 5,155,777 | A |  | 10/1992 | Angelopoulos et al. |
| 5,370,825 | A |  | 12/1994 | Angelopoulos et al. |
| 5,932,144 | A | * | 8/1999 | Shimizu et al. ............... 252/500 |
| 6,756,474 | B2 |  | 6/2004 | Hsu |
| 6,830,708 | B2 |  | 12/2004 | Angelopoulos et al. |
| 7,166,241 | B1 |  | 1/2007 | Angelopoulos et al. |
| 7,713,446 | B2 |  | 5/2010 | Epstein et al. |
| 8,038,907 | B2 |  | 10/2011 | Epstein et al. |
| 2004/0021131 | A1 |  | 2/2004 | Blanchet-Fincher et al. |
| 2009/0072201 | A1 |  | 3/2009 | Hsu et al. |
| 2010/0041865 | A1 |  | 2/2010 | Jung et al. |
| 2011/0151153 | A1 | * | 6/2011 | Felder et al. ............... 428/32.86 |

FOREIGN PATENT DOCUMENTS

CN    101260234 A    9/2008
CN    101824207 A    9/2010

OTHER PUBLICATIONS

Sharma et al., "Synthesis and Characterization of a Copolymer: Poly(Aniline-Co-Fluoroaniline)", Journal of Applied Polymer Science, vol. 81, 1460-1466, (2001).*
Gok, et al., "Synthesis and characterization of conducting substituted polyanilines", Synthetic Metals 142 (2004) 41-48, available online Oct. 20, 2003.

(Continued)

*Primary Examiner* — Amanda C. Walke
(74) *Attorney, Agent, or Firm* — Michael R. Roberts

(57) ABSTRACT

A water dispersible composition comprises a polyaniline copolymer having a weight average molecular weight of at least 30,000 and a polymeric acid comprising sulfonic acid groups. The polyaniline copolymer comprises i) about 10 mol % to about 15 mol % of a fluorine-containing first aniline repeat unit based on total moles of repeat units in the polyaniline copolymer, and ii) a second aniline repeat unit comprising no fluorine. The sulfonic acid groups of the polymeric acid are present in a molar amount greater than or equal to total moles of repeat units of the polyaniline copolymer. The composition has a conductivity of at least 0.0001 S/cm.

21 Claims, 5 Drawing Sheets

(56) References Cited

OTHER PUBLICATIONS

Han, et al., "Highly Conductive and Electroactive Fluorine-Functionalized Polyanilines", Macromolecules 2007, 40, 8969-8973, Published on Web Nov. 7, 2007.

Sharma, et al., "Synthesis and Characterization of a Copolymer: Poly(Aniline-Co-Fluoroaniline)", Journal of Applied Polymer Science, vol. 81, 1460-1466 (2001); first published online: May 23, 2001.

Chinese IPO, International Search Report and Written Opinion, PCT/IB2013/055097, date of mailing Dec. 12, 2013.

* cited by examiner

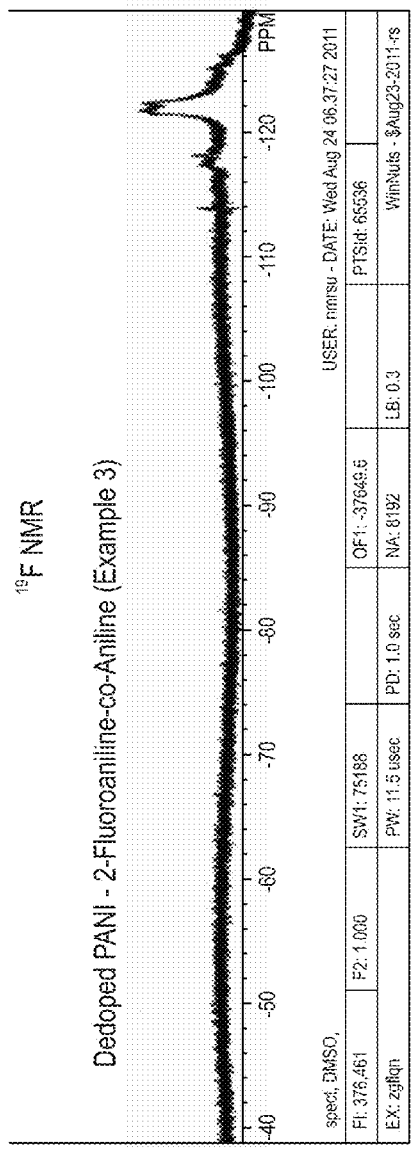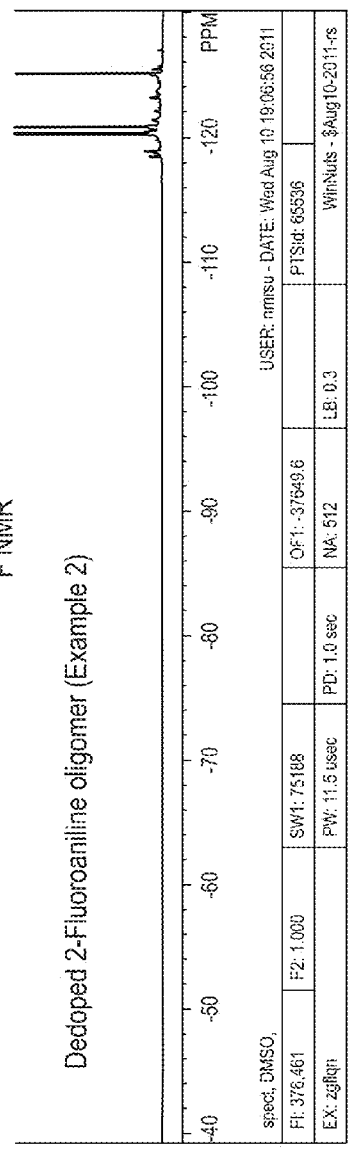

WATER-DISPERSIBLE ELECTRICALLY CONDUCTIVE FLUORINE-CONTAINING POLYANILINE COMPOSITIONS FOR LITHOGRAPHY

BACKGROUND

The present invention relates to synthesis of water-dispersible electrically conductive fluorine-containing polyaniline compositions for lithography, and more specifically, to compositions comprising a polymeric acid and copolymers of fluorine-containing anilines for conductive discharge layers.

Polyanilines (PANIs) are some of the most important electrically conductive organic polymers. Water dispersible PANIs have many potential applications including antistatic coatings, conductive paints for corrosion resistance, sensors, and conductive topcoats for electron beam (e-beam) resists. E-beam resists develop a surface potential during exposure that can lead to image placement errors of up to several nanometers, resulting in poor critical dimension (CD) uniformity and image quality. To address this problem, a conductive topcoat, also referred to herein as a conductive discharge layer (CDL), can be used with e-beam resists. The CDL can be removed during subsequent processing steps.

Early conductive PANIs doped with inorganic acids were intractable solids that could not be dispersed in solvents or melted for processing. Subsequently, PANIs doped with small molecule organic acids such as camphor sulfonic acid were found to be dispersible in a limited number of organic solvents such as N-methylpyrrolidine (NMP). Later, water dispersible PANIs were made from aniline monomers by complexing them to polymeric acids such as poly(4-styrenesulfonic acid) and subsequently polymerizing them. This method is described as template-guided polymerization, which is now extensively used to make water dispersible PANIs (U.S. Pat. Nos. 5,370,825, 6,830,708, 7,166,241). In this method, the polymeric acid acts as a template for the polymerization and also as a dopant to the resulting PANI.

Template-guided polymerization of 2-alkyl and 2-alkoxy anilines has been studied extensively. The doped polyanilines of these monomers have greater dispersibility in water than that of the parent unsubstituted aniline polymer, albeit with somewhat lower conductivities. However, these materials do not include water-dispersible fluorine-functionalized polyanilines.

Polymers and co-polymers of 2-fluoroaniline formed by conventional chemical and electrochemical oxidation methods (non-template guided) produce PANIs that are not water-dispersible. Moreover, the polymer molecular weights are low (about $4 \times 10^3$) and the doped polymers, which are not water dispersible, are poorly conducting ($10^{-6}$ S/cm to $10^{-3}$ S/cm) compared to 2 S/cm to 3 S/cm for unsubstituted polyaniline (A. Gok, B. Sari, M. Talu, Synth. Met. 2004, 142, 41 and A. L. Sharma, V. Saxena, V. Annapoorani, B. D. Malhotra, J. Appl. Polym. Sci. 2001, 81, 1460). These observations were attributed to the high electronegativity of fluorine that reduces the electron density of the polymer backbone. However, fluorine-functionalized polyanilines synthesized by a post-polymer modification of unsubstituted polyaniline have high conductivity (0.1 S/cm to 3 S/cm), indicating that the electronegativity of the fluorine group is not solely responsible for the poor conductivity of the conventionally prepared fluorine-containing PANIs (Chien-Chung Han and Hsin-Yu Chen, Macromolecules, 2007, 40, 8969-8973). The probable reason appears to be the sluggish chain propagation reaction of fluorine substituted anilines which results in low molecular weight polymers having poor conductivity.

Therefore, a continuing need exists for water dispersible fluorine-containing PANIs having conductivities suitable for conductive discharge layers (topcoats) used in e-beam lithography.

SUMMARY

Accordingly, a water dispersible composition is disclosed, comprising:
a polyaniline copolymer having a weight average molecular weight of at least 30,000, the polyaniline copolymer comprising i) about 10 mol % to about 15 mol % of a fluorine-containing first aniline repeat unit based on total moles of repeat units in the polyaniline copolymer, and ii) a second aniline repeat unit comprising no fluorine; and
a polymeric acid comprising sulfonic acid groups;
wherein the sulfonic acid groups of the polymeric acid are present in a molar amount greater than or equal to total moles of repeat units of the polyaniline copolymer, and the composition has a conductivity of at least 0.0001 S/cm.

Also disclosed is an aqueous mixture comprising about 1 wt % to about 4 wt % of a water dispersible composition based on total weight of the aqueous mixture, the composition comprising I) a polyaniline copolymer having a weight average molecular weight of at least 30,000, the polyaniline copolymer comprising i) about 10 mol % to about 15 mol % of a fluorine-containing first aniline repeat unit based on total moles of repeat units in the polyaniline copolymer and ii) a second aniline repeat unit comprising no fluorine, and II) a polymeric acid comprising sulfonic acid groups, wherein the sulfonic acid groups of the polymeric acid are present in a molar amount greater than or equal to total moles of repeat units of the polyaniline copolymer, and the composition has a conductivity of at least 0.0001 S/cm.

Further disclosed is multilayered structure comprising a conductive discharge layer disposed on a photoresist layer, the conductive discharge layer comprising the above-described composition.

A method is disclosed, comprising:
agitating a mixture comprising i) a polymeric acid comprising a plurality of sulfonic acid groups, ii) at least one fluorine-containing aniline monomer, iii) at least one non-fluorine-containing aniline monomer, iv) an oxidant, and v) water, thereby forming a polyaniline copolymer; and
precipitating together the polyaniline copolymer and the polymeric acid, thereby forming a water dispersible composition;
wherein
the polyaniline copolymer has a weight average molecular weight of at least 30,000,
the polyaniline copolymer comprises i) at least 5 mol % of a fluorine-containing first aniline repeat unit based on total moles of repeat units of the polyaniline copolymer and ii) a second aniline repeat unit comprising no fluorine,
the sulfonic acid groups of the polymeric acid are present in the composition in a molar amount greater than or equal to total moles of repeat units of the polyaniline copolymer, and
the composition has a conductivity of at least 0.0001 S/cm.

The above-described and other features and advantages of the present invention will be appreciated and understood by those skilled in the art from the following detailed description, drawings, and appended claims.

BRIEF DESCRIPTION OF THE SEVERAL VIEWS OF THE DRAWINGS

FIGS. 3A and 3B are a set of $^{19}$F NMR spectra comparing dedoped Example 3, poly(2-fluoroaniline-co-aniline) and dedoped Example 2, oligo(2-fluoroaniline).

DETAILED DESCRIPTION

Figure 1A:
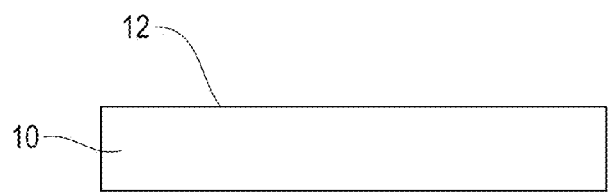
FIGS. 1A to 1F are cross-sectional layer diagrams showing the process of employing a conductive discharge layer (topcoat) over a photoresist layer.

Preferred embodiments of the invention are based on water-dispersible compositions comprising a non-covalent complex of a polymeric acid and a fluorine-containing polyaniline copolymer, which form useful conductive discharge layers for e-beam lithography. Films prepared with the compositions have a conductivity of at least 0.0001 S/cm.

Herein, an "aniline repeat unit" is a polymer repeat unit that can be derived from a substituted or unsubstituted aniline monomer. The aniline repeat unit comprises a 6-carbon backbone ring and a backbone nitrogen. The backbone rings and backbone nitrogens of a polyaniline chain are arranged in an alternating sequence, but can have different electronic configurations. The 6-carbon backbone ring can be represented by two extremes of electron delocalization, the quinoidal form:

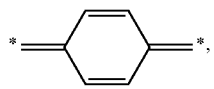

and the arylene form:

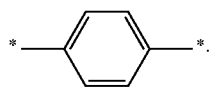

The two forms are not mutually exclusive in the polyaniline copolymer structure. That is, the 6-carbon backbone ring of a single aniline repeat unit can have the quinoidal form, arylene form, or an average thereof depending on the extent of oxidation of the polymer chain and delocalization of the pi electrons of the backbone. The starred bonds represent attachment points to the backbone nitrogens of the polyaniline copolymer chain (i.e., the starred endpoints are not carbons). The backbone nitrogen of an aniline repeat unit can be represented by two extremes, an imine (*—N=*) form and secondary amine (i.e., *—N(H)—*) form. These two forms of the amine are not mutually exclusive in the polyaniline copolymer structure. The backbone nitrogen of a single aniline repeat unit can have the imine form, secondary amine form, or an average thereof depending on the extent of oxidation of the polymer chain and delocalization of the pi electrons of the backbone.

A linear homopolymer of aniline (i.e., homopolyaniline) can be represented by formula (1):

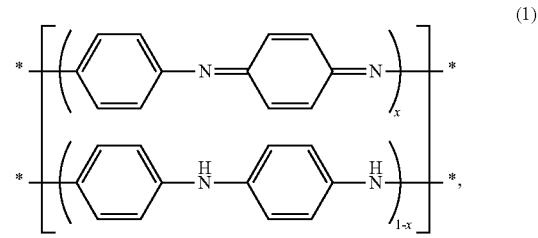

(1)

In the above notation, the stacked structures within the square brackets of formula (1) represent possible dimer forms of adjacent aniline repeat units of the homopolyaniline chain. The subscript x represents the average mole fraction of dimers having the diimine structure (top), and the subscript 1-x represents the average mole fraction of dimers having the diamine structure (bottom), where $0<x\leq 1$. It should be understood by this representation that the pi electrons of a region of extended conjugation (e.g., the top dimer having the conjugated arylene and quinoidal rings) are shared by the double and single bonds of the conjugated region. An extended conjugated region can comprise two or more aniline repeat units. The above notation does not indicate the degree of polymerization of the aniline repeat unit, which can be in a range of about several hundred to several thousand.

An average repeat unit of homopolyaniline can also be represented by the formula (2):

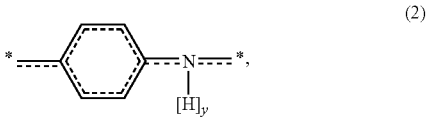

(2)

wherein y is 0 or 1. The dotted line segments mean the electron density is shared between the double bonds and single bonds of the repeat unit, the extreme forms of the repeat unit electronic configuration being the arylene and quinoidal forms of the ring, and the imine and secondary amine forms of the nitrogen. When the nitrogen is bonded to two arylene rings, y is 1. When the nitrogen is bonded to a quinoidal ring and an arylene ring, y is 0. The starred bonds indicate attachment points to adjacent repeat units (i.e., the starred endpoints are not carbons).

The polyaniline copolymer of the invention comprises at least a fluorine-containing first aniline repeat unit and a second aniline repeat unit having no fluorine. The fluorine-containing first aniline monomer can be used singularly or in combination with one or more other fluorine-containing aniline monomers to prepare the polyaniline copolymer. Likewise, the second aniline monomer having no fluorine can be used singularly or in combination with one or more other aniline monomers containing no fluorine to prepare the polyaniline copolymer. When more than one fluorine-containing first aniline monomer is used, the combined fluorine-containing aniline repeat units are present in the polyaniline copolymer in an amount of at least 5 mol %.

Using the notation of formula (1), the polyaniline copolymer of the invention can also be represented by the formula (3):

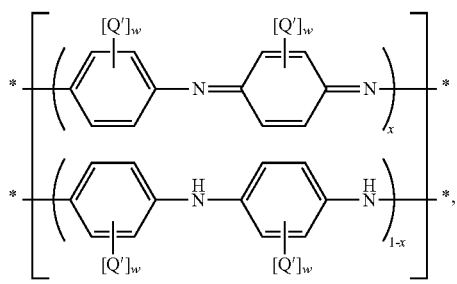

wherein x has a value greater than 0 and less than 1, and x represents the average mole fraction of dimers having the diimine structure (top), 1-x represents the average mole fraction of dimers having the diamine structure (bottom), each w is an independent integer having a value of 0 to 4, and each Q' is a monovalent radical independently selected from the group consisting of fluorine-containing substituents and non-fluorine-containing substituents, wherein at least 10% of the backbone rings of formula (3) comprises a fluorine-containing Q' substituent. It should be understood that a carbon of a backbone ring of formula (3) that is not bonded to a nitrogen or to a Q' substituent is bonded to a hydrogen. In an embodiment, about 10 mol % to about 15 mol % of the backbone rings of formula (3) comprise a fluorine-containing Q' substituent. In another embodiment, each fluorine-containing Q' substituent is independently selected from the group consisting of fluoride (*—F), trifluoromethyl (*—CF$_3$), and trifluoromethoxy (*—OCF$_3$). The polyaniline copolymer backbone also has at least one region of extended conjugation comprising at least two repeat units (e.g., the top dimer).

Using the notation of formula (2), the first aniline repeat unit of the polyaniline copolymer of the invention can be represented by formula (4):

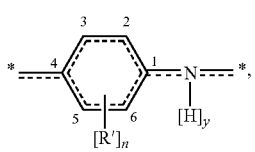

wherein y is 0 or 1, n is an integer of 1 to 4, each R' is a monovalent radical independently selected from the group consisting of fluorine-containing substituents and non-fluorine containing substituents, and R' of formula (3) is a fluorine-containing substituent. The dotted line segments mean the electron density is shared between the double bonds and single bonds of the repeat unit, the extreme forms of the electronic configuration being the arylene and quinoidal forms of the ring, and the imine and secondary amine forms of the nitrogen. Carbons 2, 3, 5, and/or 6 of the 6-carbon ring can be bonded to an R' group or to a hydrogen. In an embodiment, n is 1 and R' is a fluorine-containing functional group attached at position 2 or 6. The first aniline repeat unit is present in the polyaniline copolymer in an amount of at least 5 mol % based on all repeat units of the polyaniline copolymer.

The second aniline repeat unit containing no fluorine is represented by the average electronic structure of formula (5):

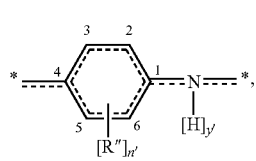

wherein y' is 0 or 1, n' is an integer of 0 to 4, and each R" is a monovalent radical independently selected from the group consisting of non-fluorine-containing substituents. Carbons 2, 3, 5, and/or 6 of the 6-carbon ring can be bonded to an R" group or to a hydrogen. In an embodiment n' is 0 or 1, and R" is attached at position 2 or 6.

The polyaniline copolymer has a weight average molecular weight (Mw) of at least 30,000 and a number average molecular weight (Mn) of at least 6000.

As indicated above, the first aniline repeat unit is present in the polyaniline copolymer in an amount of at least 5 mol %, more preferably 5 mol % to 20 mol %, and most preferably about 10 mol % to about 15 mol %, based on total moles of repeat units in the polyaniline copolymer.

The polyaniline copolymer is preferably prepared by a template guided oxidative polymerization of a mixture comprising a fluorine-containing first aniline monomer and a non-fluorine-containing second aniline monomer. The template is a polymeric acid. The polymeric acid is preferably, although not necessarily, the same polymeric acid as the polymeric acid of the composition used to prepare the conductive discharge layer (CDL). The polymeric acid for the polymerization can be any polymeric acid suitable for a polymerization template. The polymeric acid used for the CDL comprises a repeat unit bearing a sulfonic acid group.

A method of preparing the disclosed composition comprises: i) agitating a mixture comprising a polymeric acid, a fluorine-containing first aniline monomer, a non-fluorine-containing second aniline monomer, a solvent, and an oxidant initiator, thereby forming a second mixture comprising a complex of the polymeric acid and a polyaniline copolymer, and ii) co-precipitating the polymeric acid and the polyaniline copolymer, thereby forming the disclosed composition.

In general, the careful control of the polymerization is characterized by control of the rate of initiation of the polymerization, and of the rate of propagation of the polymer. This control can be provided, in turn, by controlling the temperature and adjusting the concentration of the polymeric acid, the aniline monomers, and the oxidant initiator to levels below those levels at which the polymerization forms a precipitate. The polymerization proceeds effectively at room temperature (25° C. to 30° C.) after initiating at ice bath temperature (greater than 0° C. and less than 10° C.). The temperature should not exceed about 30° C. because gelation can occur due to overly rapid reaction. Thus, lower reaction temperatures are preferred as they permit greater regulation of the polymerization and enhance water solubility of the resultant product.

When the template polymeric acid is the same as the polymeric acid used to form the CDL (topcoat), the polymeric acid and the polyaniline copolymer can be isolated together in the form of a complex. In this instance, the polymerization is allowed to proceed to completion, after which the polymer complex is recovered from solution by precipitation (e.g., by adding acetone to the aqueous product solution). The solid product can be treated with solvent to remove oligomeric species and any unconsumed initiator, and isolated by filtration and drying. The resulting powder composition is readily resoluble in water, preferably deionized water.

Alternatively, the polyaniline copolymer can be isolated substantially free of the template polymeric acid by precipitating the polyaniline copolymer in basic solution following the polymerization. In some instances the polyaniline copolymer can be redissolved in an organic or aqueous organic solvent, combined with the same or a different polymeric acid, and the resulting polymer complex isolated, thereby forming a composition useful for preparing a conductive discharge layer.

Exemplary polymeric acids include but are not limited to poly(4-styrenesulfonic acid) (PSSA), poly(vinyl sulfonic acid), poly(2-acrylamido-2-methyl-1-propanesulfonic acid), and copolymers thereof. Other examples of polymeric acids include poly(acrylic acid), poly(methacrylic acid), poly(vinyl sulfuric acid), poly(vinyl boric acid), poly(styrene boric acid), poly(vinyl phosphoric acid), and poly(styrene phosphoric acid), which can be used together with the aforementioned sulfonic acid containing polymers. The polymeric acid can comprise repeat units which include one or more structural isomers of a polymerizable monomer (e.g., repeat units derived from 4-styrenesulfonic acid, 3-styrenesulfonic acid, 2-styrenesulfonic acid, and combinations thereof).

Exemplary solvents for the polymerization include water, an organic solvent, and combination thereof.

Exemplary oxidant initiators include but are not limited to ammonium persulfate, hydrogen peroxide, ferric chloride, potassium dichromate and potassium permanganate.

Exemplary first aniline monomers include but are not limited to

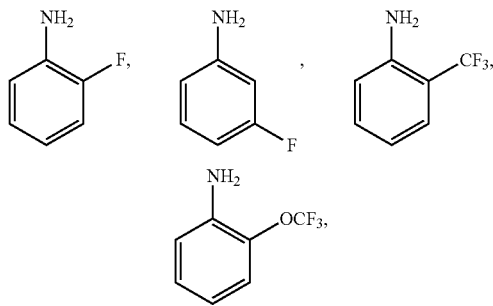

and combinations thereof.

Exemplary second aniline monomers include but are not limited to

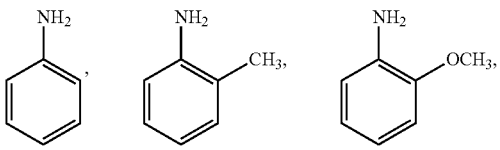

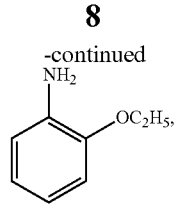

and combinations thereof.

In a preferred embodiment, the polymeric acid used as the polymerization template and the polymeric acid of the of the CDL are the same: poly(4-styrenesulfonic acid) (PSSA).

A method of forming a conductive discharge layer comprises i) forming at least a 1 wt % aqueous mixture of the disclosed composition, ii) casting the solution on a layer of photoresist, and iii) removing the solvent, thereby forming the conductive discharge layer disposed on the photoresist. A surfactant can optionally be employed as a coating aid if desired.

Figure 1B:
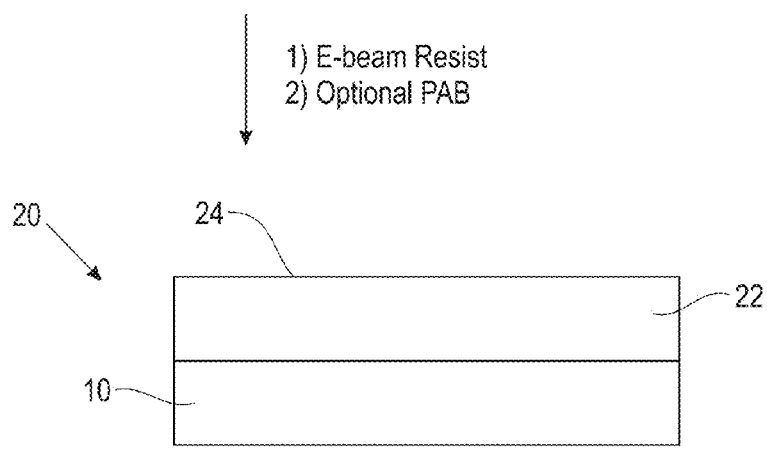
Figure 1C:
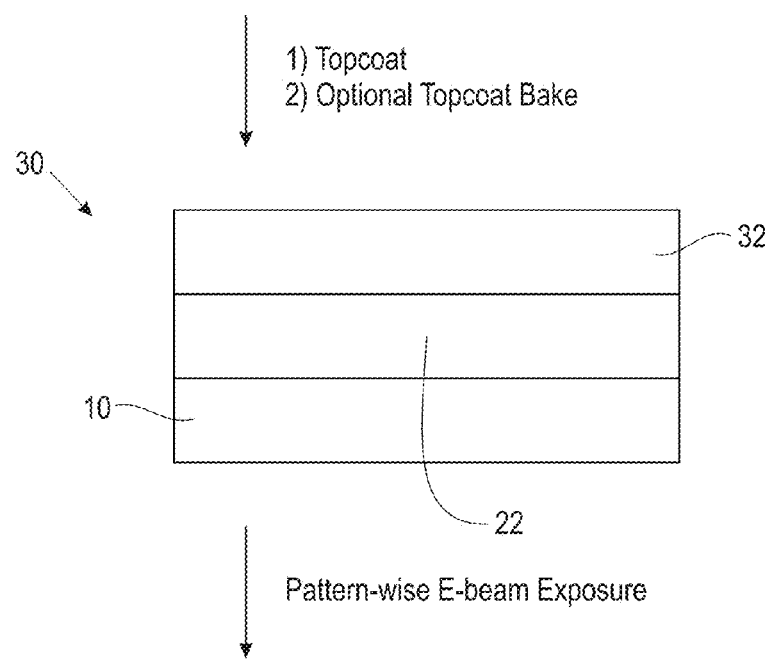
Figure 1D:
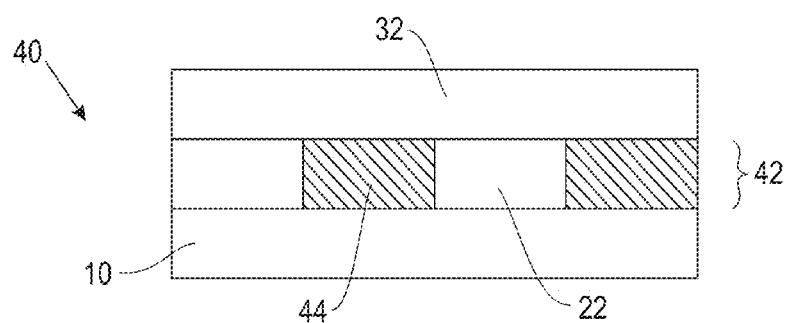
Figure 1E:
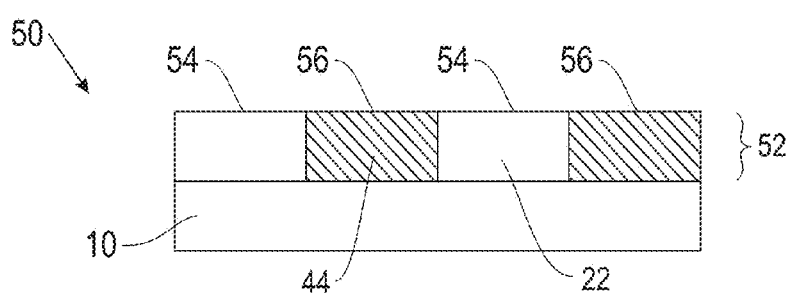
Figure 1F:
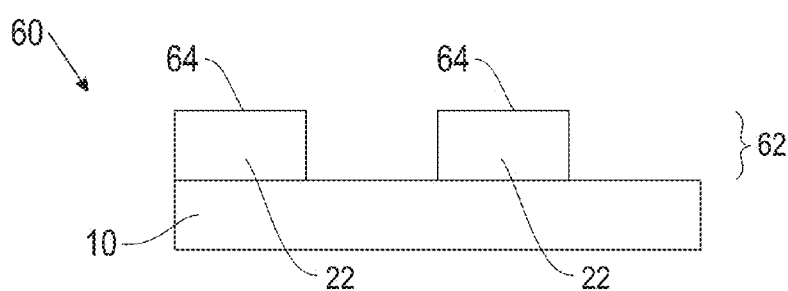

The schematic layer diagrams of FIGS. 1A to 1E illustrate a method of forming a lithographically patterned photoresist layer on a wafer substrate utilizing a conductive discharge layer (topcoat) coated above the photoresist layer. The photoresist is disposed on surface 12 of substrate 10 (FIG. 1A), thereby forming photoresist layer 22 of structure 20 (FIG. 1B). Photoresist layer 22 can be treated with an optional post-application bake (PAB) and/or an optional solvent rinse under suitable conditions of time and temperature. An aqueous mixture comprising the polyaniline copolymer and the polymeric acid is then deposited on surface 24 of photoresist layer 22. Removal of residual solvent results in conductive discharge layer 32 (topcoat) disposed on photoresist layer 22 (FIG. 1C, structure 30). Structure 30 can be treated with an optional topcoat bake (TB) prior to pattern-wise exposure. The exposure produces photoresist layer 42 of structure 40 (FIG. 1D) composed of regions of exposed photoresist 44 and regions of non-exposed photoresist 22. Removal of the conductive discharge layer 32 using an aqueous rinse results in structure 50 (FIG. 1E). Structure 50 comprises exposed photoresist layer 52 having top surface 54 (of non-exposed photoresist 22) and top surface 56 (of exposed photoresist 44) in contact with air. Photoresist layer 52 can be treated with an optional post-exposure bake (PEB) and/or an optional solvent rinse under suitable conditions of time and temperature before development. The PAB, TB, PEB and/or solvent rinse(s) can enhance solubility differences of the exposed and non-exposed photoresist in a given developer. In this instance the exposed photoresist 44 has greater solubility in a developer compared to non-exposed photoresist 22. Consequently, aqueous development affords a positive-tone image by removing regions of exposed photoresist 44, thereby forming layered structure 60 comprising patterned photoresist layer 62 (FIG. 1F). Patterned photoresist layer 62 is a topographical relief pattern comprising photoresist features 64 composed of non-exposed photoresist 22. The topographical relief pattern of patterned photoresist layer 62 can be transferred to substrate 10 by known methods (e.g., oxygen ion etching).

The conductive discharge layer can be formed by a processes such as spin coating (also referred to as spin casting), spray coating, dip coating, doctor blading, roll coating, and the like. More particularly, a 1 wt % to 4 wt % aqueous mixture of the disclosed composition can be spin coated onto the surface of the photoresist layer, followed by removal of the solvent to produce the conductive discharge layer.

The conductive discharge layer can have a thickness of about 10 nm to 100 nm, 20 nm to 50 nm, and preferably, 20 nm to 40 nm. In an embodiment, the conductive discharge layer has a thickness of about 30 nm.

The conductive discharge layer can be treated with a post-application bake (PAB) of 50° C. to 300° C., more particularly 50° C. to 110° C., for a period of 1 sec to 1 hour, In an embodiment, the conductive discharge layer is given a PAB of about 90° C. for about 60 seconds.

Pattern-wise exposure of the photoresist layer can be accomplished using radiation of various types, including ultraviolet (UV) radiation of wavelengths from 450 nm to 300 nm, deep ultraviolet (DUV) radiation of wavelengths from 300 nm to 120 nm, extreme ultraviolet (EUV) radiation of wavelengths from 120 nm to 8 nm, electron-beam (e-beam) radiation, x-ray radiation, combinations of the foregoing, and other suitable sources. Examples include 193 nm ArF excimer source, an EUV source, or an electron beam. DUV and EUV exposures employ a specific mask to generate patterns in the photoresist layer. E-beam lithography writes patterns directly to the photoresist. Exemplary radiation sources include single wavelength and/or narrow band radiation sources, Sn plasma sources for EUV, specific mercury emission lines, lasers, and particle beam emitters. For less stringent conditions, a broad band multiple wavelength source can be used. Exemplary radiation wavelengths include 436 nm, 405 nm, 365 nm, 334 nm, 313 nm, 254 nm, 248 nm, 193 nm, 157 nm, 126 nm, and 13.5 nm.

The pattern-wise exposure can be performed either dry or under immersion conditions, particularly immersion conditions utilizing a suitable high index of refraction fluid between the lens element and the wafer. Immersion fluids include high index fluids such as decane and various fluorinated solvents.

In a preferred embodiment, the photoresist layer comprises a positive-tone photoresist capable of chemical amplification, and the pattern-wise exposure is conducted using e-beam.

The exposed structure comprising the conductive discharge layer can be treated with a post-exposure bake (PEB) of 50° C. to 300° C., more particularly 50° C. to 250° C., for a period of 1 sec to 1 hour, and still more particularly 10 sec to 10 minutes prior to removal of the conductive discharge layer.

Removal of CDL can be performed at three different stages in the process: i) after exposure (before the optional PEB), generally with a water rinse of about 10 seconds to about 60 seconds, ii) after the PEB with a water rinse, or iii) during the resist development step, together with the resist, generally using an aqueous base and/or an organic solvent. If the CDL is removed before development, the rinsed structure can optionally be baked at 50° C. to 100° C. for 10 sec to 10 minutes prior to development of the photoresist layer.

The developer can comprise water and/or an organic solvent. The exposed photoresist layer is preferably developed with an aqueous alkaline developer (e.g., 0.26 N tetramethyl ammonium hydroxide (TMAH)). In negative-tone development, the developer selectively removes the non-exposed photoresist. In the preferred positive-tone development, the developer selectively removes the exposed photoresist, resulting in a topographically patterned photoresist layer comprising non-exposed photoresist disposed on a first surface of the substrate. A second surface of the substrate can have substantially no residual photoresist disposed thereon, or have no residual photoresist disposed thereon.

Exemplary organic solvents for developers include anisole, ethylene glycol, propylene glycol, and 4-methyl-2-pentanol, n-butyl acetate, and mixtures thereof. The developer can also include a supercritical fluid, such as liquefied methane, liquefied ethane, liquefied propane, or liquefied carbon dioxide. The non-alkaline developer comprising supercritical fluids can further comprise additional components including organic solvents, surfactants, and salts in order to modify various properties of the developer.

The above-described methods permit a photoresist feature width of from 1 to 1000 nm, from 1 to 500 nm, from 1 to 300 nm, from 1 to 200 nm, from 1 to 150 nm, or more particularly from 1 to 100 nm.

The wafers can be reworked. Reworking a wafer can occur, for example, when post-development inspection detects unacceptable defects (e.g., misalignment) in the photoresist pattern. The wafer can be solvent stripped using, for example, 0.26 N TMAH or dilute hydrogen peroxide to remove the photoresist before the wafer is etched or otherwise irreversibly altered. The wafer can then be resubmitted to the photoresist pattern generating process.

Also disclosed is an aqueous mixture comprising about 1 wt % to about 4 wt % of the disclosed composition based on total weight of the aqueous mixture. The aqueous mixture can further comprise a surfactant. In an embodiment, the surfactant is a fluorinated surfactant (e.g., Zonyl FSN). In another embodiment, the polymeric acid of the dispersed composition has a weight average molecular weight of about 25,000 to about 200,000.

The aqueous mixture is capable of forming a conductive film layer. The disclosed composition is dispersed in the aqueous mixture in the form of particles having an average circular diameter between 0 micrometers and 2 micrometers.

Also disclosed are multi-layered structures prepared using the above-described methods, which can be used in a process of constructing a semiconductor device. It should be understood that the invention is not limited to any specific device structure.

EXAMPLES

Materials used in the following examples are listed in Table 1

TABLE 1

| ABBREVIATION | DESCRIPTION | SUPPLIER |
|---|---|---|
| PSSA | Poly(4-styrenesulfonic acid), Mw = 75,000, 18% solution in water | Sigma-Aldrich |
| EOAN | 2-Ethoxyaniline | Sigma-Aldrich |
| Zonyl FSN | Fluorinated surfactant | Sigma-Aldrich |
| SEBP 9012 | Chemically Amplified Positive E-beam Photoresist | Shin-Etsu Corporation |

Herein, Mn is the number average molecular weight, Mw is the weight average molecular weight, and MW is the molecular weight of one molecule.

Unless indicated otherwise, parts are parts by weight, temperature is in Centigrade degrees and pressure is at or near atmospheric. All the starting materials, including aniline, substituted anilines, and ammonium persulfate, were purchased from commercial sources. Most of the aniline monomers were distilled prior to polymerization.

Where appropriate, the following techniques and equipment were utilized in the Examples: $^1$H NMR, $^{13}$C NMR, and $^{19}$F NMR spectra of the polymer solutions were obtained at room temperature on an Avance 400 spectrometer. Thermogravimetric analysis (TGA) was performed at a heating rate of 5° C./min in $N_2$ on a TA Instrument Hi-Res TGA 2950 Thermogravimetric Analyzer. Molecular weights were measured in tetrahydrofuran (THF) or N,N-dimethylformamide (DMF) on a Waters Model 150 chromatograph, relative to polystyrene standards. IR spectra of a sample film cast on a KBr plate were recorded using a Nicolet 510 FT-IR spectrometer. Film thickness was measured on a Tencor alpha-step 2000. Electron beam exposure was performed using a Vistec VB6 at 100 keV energy, 0.5 nA current and 15 nm spot size (Gaussian shape beam).

Solid State NMR was Performed as Described Below:

Cross-polarization (CP) magic-angle-spinning (MAS) $^{13}C$ NMR spectra were obtained with a Bruker Avance 500 spectrometer operating at 125.762 MHz, 500.109 MHz, and 470.540 MHz for $^{13}C$, $^{1}H$, $^{19}F$ respectively. Ramped-amplitude cross polarization [Metz] and two-pulse phase-modulated (TPPM) [Bennett] $^{1}H$ and $^{19}F$ decoupling were employed. The amplitude of the $^{13}C$ spin locking field was ramped from 80 to 100% during the contact time and the $^{1}H$ and $^{19}F$ decoupling fields were 110 kHz ($\gamma B_1/2\pi$) and 100 kHz respectively. The MAS spinning speed was 12 kHz and the relaxation delay was 5 seconds. Spectra were obtained by averaging 16000 scans on 30-100 mg of sample contained in a 4 mm OD Bruker MAS rotor. The $^{13}C$ chemical shift was externally referenced using a rotor containing liquid tetramethylsilane (TMS). Single pulse $^{19}F$ MAS spectra were obtained with a spinning speed of 12 kHz. The $^{19}F$ chemical shift was referenced externally using hexafluorobenzene and assuming a chemical shift of −162.9 ppm.

Conductivities of the doped PANI samples were studied using direct drop casting of a water dispersion (1 wt % to 4 wt %) on a quartz substrate. The substrates used for this process were made of quartz glass having a diameter of 1 inch. The substrates were cleaned for 60 seconds using dry oxygen in a plasma etching tool (MARCH Px-250 RIE tool) at an RF power of 250 Watts and a pressure of 300 mTorr. Then, PANI solution was deposited on top of the substrate using a pipette and the substrates were allowed to dry at room temperature overnight. The conductivity test was performed using a four-point probe measurement system to obtain the I-V measurements. The thickness of the film was determined using a profilometer (Tencor Alpha Step 500 Surface Profiler). From the measurements obtained from the four-point probe measurement system and the profilometer, the conductivity of the PANIs was calculated.

UV spectra of doped PANI. A 2% water dispersion of the composition was made and filtered through 1 micrometer glass filter. A film on a quartz plate was drop cast and dried overnight. The UV spectrum was recorded on an Agilent 8453 UV/Visible spectrophotometer.

UV spectra of dedoped PANI. A solution of the composition was made in N-methylpyrrolidone (NMP). A film on a quartz plate was drop cast and dried overnight. The UV spectrum was recorded on an Agilent 8453 UV/Visible spectrophotometer.

Elemental analysis of the polymer samples was carried out by Galbraith Laboratories, Inc.

In previous publications and patents, the amount of oxidant (ammonium persulfate) used to synthesize water dispersible PANIs has varied from 25 mol % (to the aniline monomers), to 125 mol %. To experimentally determine the optimum amount of ammonium persulfate needed to obtain the desired polymers in good yields, commercially available poly(4-styrenesulfonic acid) (PSSA) was used as the polymer template and 2-ethoxyaniline (EOAN) as the monomer. PSSA-EOAN complex was prepared and the solid state $^{13}C$ NMR of the complex was recorded. Then, in separate experiments the PSSA-EOAN complex was oxidized with various amounts of ammonium persulfate oxidant and the resulting polymers were isolated. The isolated polymers were analyzed by solid state $^{13}C$ NMR (FIG. 2).

Figure 2:
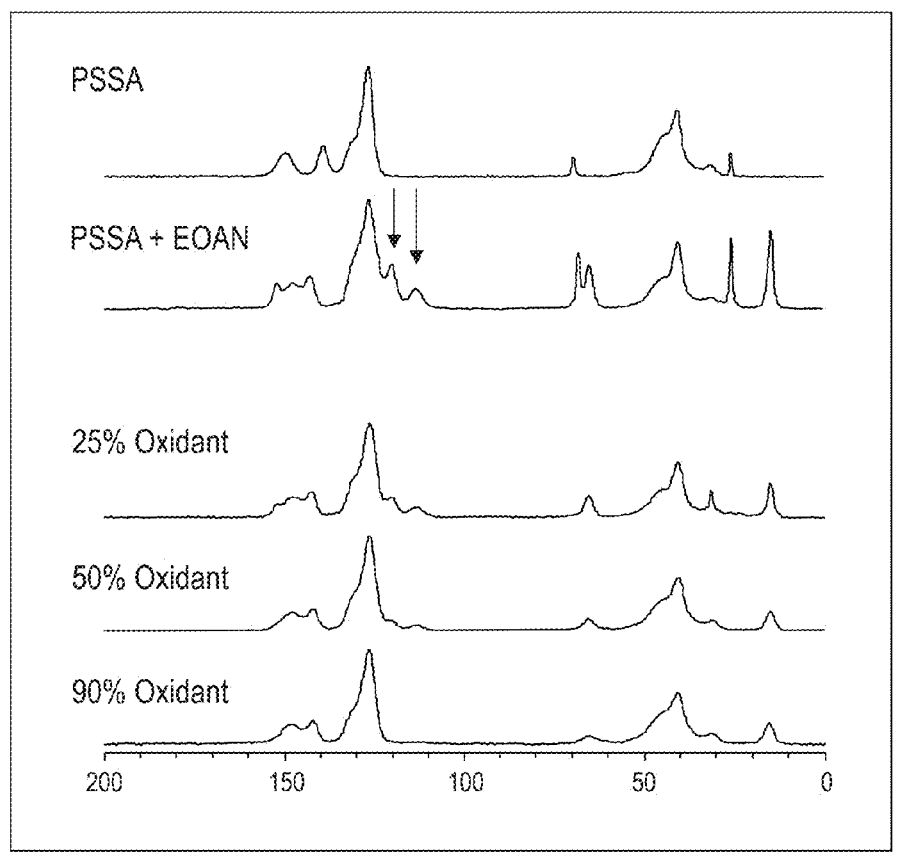
FIG. 2 is a series of $^{13}$C NMR spectra showing the effect of increasing ammonium persulfate oxidant level on the polymerization of 2-ethoxyaniline (EOAN) (arrows indicating aniline peaks) when the polymerization was conducted using poly(4-styrenesulfonic acid) (PSSA) as a template guide. About 90 mol % of oxidant was needed to completely oxidize the EOAN.

From the $^{13}C$ NMR study, it became apparent that about 90 mol % of oxidant was needed to completely oxidize the aniline (or substituted aniline) monomer as determined by the disappearance of aniline peaks indicated by arrows in FIG. 2. High yields of doped PANIs were prepared using this optimized method. Dispersions containing about 4% by weight of the polymer complex (PANI-PSSA) were prepared in water by simply stirring the solid with deionized (DI) water.

Example 1 (Comparison)

General Procedure for the Synthesis of Water Dispersible Doped PANI (An Unsubstituted Aniline Monomer was Used in this Example)

PSSA (20.44 grams of 18 wt % water solution, 3.68 g polymer, 0.02 moles of sulfonic acid units) was diluted in a flask with deionized (DI) water (116.20 g). Distilled aniline (1.86 grams, 1.82 ml, 0.02 mole) was injected into this solution and the mixture was stirred with a magnetic stirrer until a clear solution resulted. The resulting solution had approximately 4 wt % of aniline-PSSA complex in water. While stirring, this solution was cooled in ice-water bath and ammonium persulfate (4.10 grams, 0.018 mole) was added at once. The solution turned dark green in about ten minutes. After 1 hour in the ice-bath, the bath was removed and the solution was stirred overnight (18 hours). The resulting dark solution was poured into 1 liter of acetone with stirring and allowed to settle overnight. Most of the liquid was decanted and the rest was filtered through a frit funnel under aspirator vacuum. The collected dark green solid was washed copiously with acetone until the filtrate became colorless. The solid was dried under vacuum. Yield: 5.56 grams. The UV spectrum of a film had a strong absorption with a lambda maximum of about 800 nm.

General procedure for dedoping (removing PSSA from) the doped PANI. The composition of doped PANI of Example 1 (2 grams, having 0.0072 moles of sulfonic acid units) was stirred with 0.29 N tetramethylammonium hydroxide (TMAH) solution (50 ml, 0.0145 moles of TMAH) for 18 hours. The solution was filtered through a frit funnel and the collected solid was thoroughly washed with DI water and dried under vacuum. 0.225 grams of the dedoped polymer was recovered. A film of the dedoped polymer had a strong absorption with a lambda maximum around 650 nm. There was no absorption around 800 nm.

In some cases, the dedoped polymers were difficult to filter. In such cases the solid was separated by centrifugation or by precipitating into acetone. The precipitate in acetone was collected by filtration and washed thoroughly with DI water.

Example 2 (Comparison)

Attempted Synthesis of Doped Poly(2-fluoroaniline)

PSSA (20.44 grams of 18 wt % water solution, 3.68 g polymer, 0.02 moles of sulfonic acid units) was diluted in a flask with DI water (125.04 grams). 2-Fluoroaniline (2.22 grams, 1.93 ml, 0.02 mole) was injected into this solution and the mixture was stirred with a magnetic stirrer until a clear solution resulted. While stirring, the solution was cooled in ice-water bath and ammonium persulfate (4.10 grams, 0.018 mole) was added at once. The solution turned brown in about ten minutes. After 1 hour in the ice-bath, the bath was removed and the solution was stirred overnight (18 hours). The resulting dark brown solution was poured into 1 liter of acetone with stirring and allowed to settle overnight. Most of the liquid was decanted and the rest was filtered through a frit funnel under aspirator vacuum. The collected reddish brown solid was washed copiously with acetone until the filtrate became colorless and dried under vacuum. Yield: 3.16 grams. This reddish brown solid dissolved readily in water. The UV spectrum of the solid did not have the characteristic absorption around 800 nm.

The molecular weight of the dedoped version of this material prepared by the above-described procedure was determined to be very low with a number average molecular weight of (Mn) of 426. Elemental analysis of a vacuum dried dedoped sample had 64.4 wt % C, 10.54 wt % F, 9.56 wt % N, and 3.60% H. Theoretical analysis was C 66.36%, F 17.50%. The $^{19}$F NMR of this material in deuterated dimethylsulfoxide (DMSO $d_6$) had three sharp peaks at 120.2, 120.8 and 125 ppm (FIG. 3B). This shows the 2-fluoroaniline did not form a useful polymer for topcoats under these conditions.

Example 3

Synthesis of Doped poly(aniline-co-2-fluoroaniline)

PSSA (20.44 grams of 18 wt % water solution, 3.68 g, 0.02 moles of sulfonic acid units) was diluted in a flask with DI water (120.70 grams). Aniline (0.93 grams, 0.91 ml, 0.01 mole) was injected into this solution and the mixture was stirred magnetically until the solution was clear. 2-Fluoroaniline (1.11 grams, 0.96 ml, 0.01 mole) was then injected into the resulting solution and the mixture was stirred magnetically until the solution was clear. The solution was cooled in ice-water bath with stirring. Ammonium persulfate (4.10 grams, 0.018 mole) was then added in one portion with stirring. The solution turned dark green in about twenty minutes. After 1 hour in the ice-bath, the bath was removed and the solution was stirred overnight (18 hours). The resulting dark solution was poured into 1 liter of acetone with stirring and allowed to settle overnight. Most of the solvent was decanted and the rest was filtered through a frit funnel under aspirator vacuum. The collected dark green solid was washed copiously with acetone until the filtrate became colorless and dried under vacuum. Yield: 6.60 grams. Based on the yield (115%), it is assumed that this polymer contains substantial amount of water. The UV spectrum of a film had a strong absorption with a lambda maximum of 800 nm. Elemental analysis of a vacuum dried (3 days) doped sample had 45.7 wt % C, 0.85 wt % F, 6.4 wt % N, 12.8 wt % S. Theoretical analysis was C: 59.08%, F: 3.33%. The amount of measured fluorine was lower than the theoretical weight percent (3.33 wt %) for a 1:1 copolymer.

The weight average molecular weight (Mw) of the dedoped sample (PSSA removed) was 31500. The number average molecular weight (Mn) of the dedoped sample was 6200.

The $^{19}$F NMR in DMSO had a broad peak centered on 122 ppm indicating a copolymer had been formed (FIG. 3A). Elemental analysis of a dedoped sample had 45.07 wt % C, 1.72 wt % F and 7.3 wt % N. Theoretical analysis was C, 72.35%., F: 9.54%. Here again the fluorine content was lower than the theoretical value for 1:1 copolymer (9.54 wt % F), indicating 2-fluoroaniline incorporation was lower than theoretical.

Examples 3 to 10

Using the general procedure of Example 2, doped copolymers of fluorine-containing anilines with non-fluorine-containing anilines were prepared and their conductivities measured. The data are presented in Table 2.

TABLE 2

| Example | Monomer A | Monomer B | Molar Feed Ratio | Polymer Mw | Polymer Mn | Mole % Monomer B in Polymer (%) | Polymer Conductivity (S/cm) |
|---|---|---|---|---|---|---|---|
| 1 (comp) | NH$_2$-phenyl | | | 38900 | 17000 | | $3.0 \times 10^{-2}$ |
| 2 (comp) | | NH$_2$-phenyl-F | | 743 | 426 | | |
| 3 | NH$_2$-phenyl | NH$_2$-phenyl-F | 1:1 | 31500 | 6200 | 15 | $1.2 \times 10^{-3}$ |

TABLE 2-continued

| Example | Monomer A | Monomer B | Molar Feed Ratio | Polymer Mw | Polymer Mn | Mole % Monomer B in Polymer (%) | Polymer Conductivity (S/cm) |
|---|---|---|---|---|---|---|---|
| 4 | aniline | 3-fluoroaniline | 1:1 | 48350 | 29000 | 15 | $2.8 \times 10^{-4}$ |
| 5 | aniline | 2-(trifluoromethoxy)aniline | 1:1 | 32817 | 9584 | 10 | $2.0 \times 10^{-3}$ |
| 6 (comp) | 2-methylaniline | | | 23140 | 14100 | | $8.1 \times 10^{-4}$ |
| 7 | 2-methylaniline | 2-(trifluoromethyl)aniline | 1:1 | 32545 | 6960 | | $3.9 \times 10^{-4}$ |
| 8 (comp) | 2-methoxyaniline | | | 81900 | 28000 | | $1.1 \times 10^{-3}$ |
| 9 | 2-methoxyaniline | 2-(trifluoromethoxy)aniline | 1:1 | 55300 | 29000 | | $5.2 \times 10^{-4}$ |
| 10 (comp) | 2-ethoxyaniline | | | 59800 | 26900 | | $6.0 \times 10^{-4}$ |
| 11 | 2-ethoxyaniline | 2-fluoroaniline | 1:1 | 48000 | 29000 | | $3.3 \times 10^{-4}$ |

Example 12

Preparation of a Conductive Topcoat Formulation

A 2 wt % of the PANI solution in DI water was prepared by stirring the doped polymer of Example 3 with water for 72 hours. A fluorinated surfactant, Zonyl FSN, was added (0.1 wt % to the total solution) to reduce the surface tension of the water solution and improve coating quality. The solution was filtered sequentially through a 1 micrometer glass filter and a 0.45 micrometer nylon filter.

Example 13

Evaluation of e-Beam Resist with Conductive Topcoat

Some of the polymers in Table 2 were evaluated as topcoats for e-beam resists. The polymers were cast from water on top of an e-beam resist and the performances were compared. A commercially available chemically amplified positive e-beam resist (SEBP 9012 from Shin-Etsu Corporation) was used for this study. The topcoats were removed with water before post-exposure bake (PEB), which is the standard procedure for conducting topcoats.

Figure 4A:
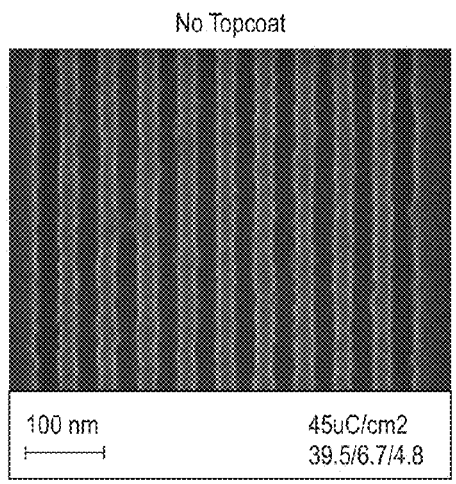
FIGS. 4A to 4C are SEM images comparing the performance of an e-beam resist with no overcoat (FIG. 4A), with a topcoat comprising Example 1 (homopolymer of aniline) (FIG. 4B), and with a topcoat containing Example 2, a copolymer of aniline and fluorine containing aniline monomer (FIG. 4C). The SEM images are 40 nm 1:1 line/space patterns.
Figure 4B:
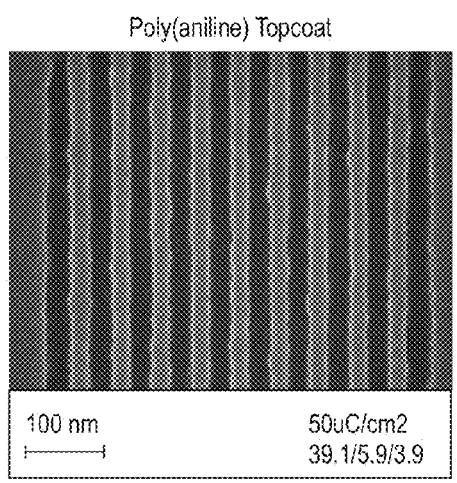
Figure 4C:
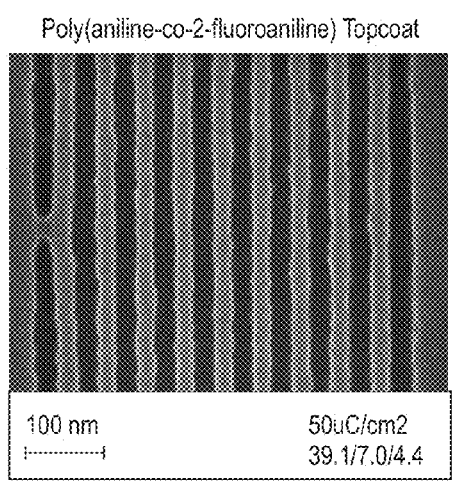

The resist was coated on a substrate and baked (Post Apply Bake or PAB) at 110° C. for 60 seconds. The conductive topcoat was coated at a film thickness of 30 nm on the resist layer and baked again at 90° C. for 60 seconds. The whole stack was then exposed pattern-wise to e-beam radiation and the conductive topcoat was removed using a DI water rinse for 20 seconds followed by 20 seconds spin for drying the substrate. The stack was then baked (Post Exposure Bake or PEB) at 90° C. for 60 seconds and developed in a 0.26 N TMAH developer for 60 seconds. The scanning electron microscopic (SEM) images obtained are presented in FIGS. 4A to 4C.

The performance of the e-beam resist using a doped poly (aniline) or a water dispersible poly(aniline-co-2-fluoroaniline) topcoat was comparable to the performance without the topcoat. Therefore, the topcoats are attractive materials for correcting placement errors.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A water dispersible composition comprising:
a polyaniline copolymer having a weight average molecular weight of at least 30,000, the polyaniline copolymer comprising i) about 10 mol % to about 15 mol % of a fluorine-containing first aniline repeat unit based on total moles of repeat units in the polyaniline copolymer, and ii) a second aniline repeat unit comprising no fluorine; and
a polymeric acid comprising sulfonic acid groups;
wherein the sulfonic acid groups of the polymeric acid are present in a molar amount greater than or equal to total moles of repeat units of the polyaniline copolymer, and the composition has a conductivity of at least 0.0001 S/cm.

2. The composition of claim 1, wherein the polymeric acid has a weight average molecular weight of about 25,000 to about 200,000.

3. The composition of claim 1, wherein the polymeric acid is selected from the group consisting of poly(4-styrenesulfonic acid) (PSSA), poly(vinyl sulfonic acid), poly(2-acrylamido-2-methyl-1-propane sulfonic acid), and copolymers thereof.

4. The composition of claim 1, wherein the polymeric acid is poly(4-styrenesulfonic acid).

5. The composition of claim 1, wherein the first aniline repeat unit is derived from a fluorine-containing aniline monomer selected from the group consisting of:

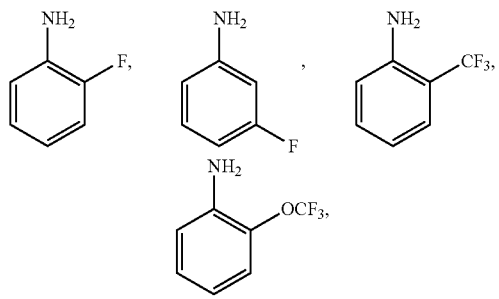

and combinations thereof.

6. The composition of claim 1, wherein the second aniline repeat unit is derived from a non-fluorine-containing aniline monomer selected from the group consisting of:

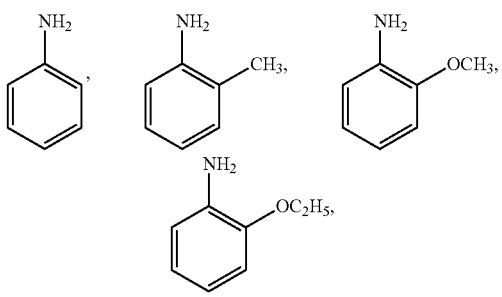

and combinations thereof.

7. An aqueous mixture comprising:
about 1 wt % to about 4 wt % of a water dispersible composition based on total weight of the aqueous mixture, the composition comprising I) a polyaniline copolymer having a weight average molecular weight of at least 30,000, the polyaniline copolymer comprising i) about 10 mol % to about 15 mol % of a fluorine-containing first aniline repeat unit based on total moles of repeat units in the polyaniline copolymer and ii) a second aniline repeat unit comprising no fluorine, and II) a polymeric acid comprising sulfonic acid groups, wherein the sulfonic acid groups of the polymeric acid are present in a molar amount greater than or equal to total moles of repeat units of the polyaniline copolymer, and the composition has a conductivity of at least 0.0001 S/cm.

8. The aqueous mixture of claim 7, wherein the aqueous mixture further comprises a surfactant.

9. The aqueous mixture of claim 8, wherein the surfactant is a fluorinated surfactant.

10. The aqueous mixture of claim 7, wherein the composition is dispersed as particles having an average particle size between 0 and 2 micrometers.

11. The aqueous mixture of claim 7, wherein the aqueous mixture is capable of forming a conductive film layer.

12. The aqueous mixture of claim 7, wherein the polymeric acid has a weight average molecular weight of about 25,000 to 200,000.

13. A multilayered structure comprising a conductive discharge layer disposed on a photoresist layer, the conductive discharge layer comprising the composition of claim 1.

14. The multilayered structure of claim 13, wherein the conductive discharge layer is capable of being removed using a water rinse after pattern-wise exposure of the photoresist layer and an optional post exposure bake.

15. The multilayered structure of claim 13, wherein the conductive discharge layer has a conductivity of at least 0.0001 S/cm.

16. A method, comprising:
    agitating a mixture comprising i) a polymeric acid comprising a plurality of sulfonic acid groups, ii) at least one fluorine-containing aniline monomer, iii) at least one non-fluorine-containing aniline monomer, iv) an oxidant, and v) water, thereby forming a polyaniline copolymer; and
    precipitating together the polyaniline copolymer and the polymeric acid, thereby forming a water dispersible composition;
wherein
    the polyaniline copolymer has a weight average molecular weight of at least 30,000,
    the polyaniline copolymer comprises i) about 10 mol % to about 15 mol % of a fluorine-containing first aniline repeat unit based on total moles of repeat units of the polyaniline copolymer and ii) a second aniline repeat unit comprising no fluorine,
    the sulfonic acid groups of the polymeric acid are present in the composition in a molar amount greater than or equal to total moles of repeat units of the polyaniline copolymer, and
    the composition has a conductivity of at least 0.0001 S/cm.

17. The method of claim 16, wherein the oxidant is selected from the group consisting of ammonium persulfate, hydrogen peroxide, ferric chloride, potassium dichromate and potassium permanganate.

18. The method of claim 16 wherein the oxidant is ammonium persulfate.

19. The method of claim 16, wherein the fluorine-containing aniline monomer is selected from the group consisting of:

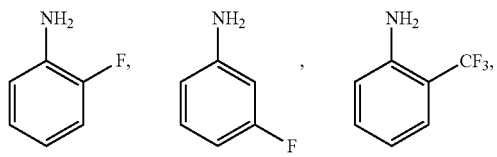

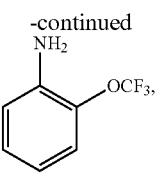

and combinations thereof.

20. The method of claim 16, wherein the non-fluorine-containing aniline monomer is selected from the group consisting of:

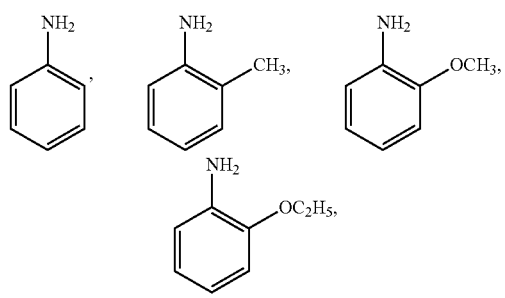

and combinations thereof.

21. A method, comprising:
    agitating a mixture comprising i) a first polymeric acid, ii) at least one fluorine-containing aniline monomer, iii) at least one non-fluorine-containing aniline monomer, iv) an oxidant, and v) water, thereby forming a second mixture comprising a polyaniline copolymer and the first polymeric acid;
    isolating the polyaniline copolymer from the first polymeric acid; and
    combining the polyaniline copolymer with a second polymeric acid comprising sulfonic acid groups, thereby forming a water dispersible composition;
wherein
    the polyaniline copolymer has a weight average molecular weight of at least 30,000,
    the polyaniline copolymer comprises i) about 10 mol % to about 15 mol % of a fluorine-containing first aniline repeat unit based on total moles of repeat units of the polyaniline copolymer and ii) a second aniline repeat unit comprising no fluorine,
    the sulfonic acid groups of the second polymeric acid are present in the composition in a molar amount greater than or equal to total moles of repeat units of the polyaniline copolymer, and
    the composition has a conductivity of at least 0.0001 S/cm.

* * * * *